(12) United States Patent
  Kathuria et al.

(10) Patent No.: US 12,682,143 B2
(45) Date of Patent: Jul. 14, 2026

(54) IDENTIFYING RTL CODE THAT CAN BE A SOURCE OF VERIFICATION COMPLEXITY FOR DOWNSTREAM EQUIVALENCE CHECKERS AND GENERATING RECOMMENDATIONS TO IMPROVE RUNTIME OF EQUIVALENCE CHECKERS

(71) Applicant: Synopsys, Inc., Sunnyvale, CA (US)

(72) Inventors: Himanshu Kathuria, Fremont, CA (US); Makarand Patil, Portland, OR (US); Rohit Kumar Ohlayan, New Delhi (IN); Paras Mal Jain, Mountain View, CA (US); Ila Verma, Rajpura (IN); Mohan Mangal, Fremont, CA (US); Jaideep Dutt, Carrollton, TX (US); Jaskaran Singh Ajimal, San Jose, CA (US); Harpreet Singh Anand, Nagar (IN)

(73) Assignee: Synopsys, Inc., Sunnyvale, CA (US)

( * ) Notice: Subject to any disclaimer, the term of this patent is extended or adjusted under 35 U.S.C. 154(b) by 728 days.

(21) Appl. No.: 18/126,164

(22) Filed: Mar. 24, 2023

(65) Prior Publication Data

US 2024/0320406 A1     Sep. 26, 2024

(51) Int. Cl.
   *G06F 30/33*      (2020.01)
   *G06F 30/327*     (2020.01)

(52) U.S. Cl.
   CPC ............ *G06F 30/33* (2020.01); *G06F 30/327* (2020.01)

(58) Field of Classification Search
   CPC .............................. G06F 30/33; G06F 30/327
   USPC .......................................................... 716/101
   See application file for complete search history.

(56) References Cited

U.S. PATENT DOCUMENTS

| | | | | | |
|---|---|---|---|---|---|
| 6,056,784 | A | * | 5/2000 | Stanion ............... | G06F 30/3323 |
| | | | | | 703/15 |
| 6,842,884 | B2 | * | 1/2005 | Lai ...................... | G06F 30/3323 |
| | | | | | 716/107 |
| 10,546,084 | B1 | * | 1/2020 | Hanna ................. | G06F 30/3323 |
| 10,803,219 | B1 | * | 10/2020 | Ziv .......................... | G06F 9/542 |
| 2004/0044975 | A1 | * | 3/2004 | Lai ...................... | G06F 30/3323 |
| | | | | | 716/107 |
| 2009/0138837 | A1 | * | 5/2009 | Baumgartner ...... | G06F 30/3323 |
| | | | | | 716/113 |
| 2010/0313175 | A1 | * | 12/2010 | Petlin .................. | G06F 30/3323 |
| | | | | | 716/106 |
| 2021/0390236 | A1 | * | 12/2021 | Jin ........................... | G06F 30/33 |

\* cited by examiner

*Primary Examiner* — Suchin Parihar
(74) *Attorney, Agent, or Firm* — Patterson + Sheridan, LLP

(57)        ABSTRACT

Aspects of the present disclosure relate to improving runtime performance of equivalence checkers by a shift left process that uses an RTL lint tool to identify RTL code that can be a source of verification complexity for the downstream equivalence checker. The RTL code is further compared to a corresponding circuit model to determine a potential gate-level location of the potentially problematic RTL code. A weight can be calculated to represent a level of verification complexity that may be generated by the particular portion of the RTL code. Further, one or more recommendations can be generated by the RTL lint tool to prevent some of the verification complexity for the downstream equivalence checker.

20 Claims, 12 Drawing Sheets

105 RTL

110 RTL lint tool

115 Synthesis tool

120 Equivalence checking tool

125 RTL

130 RTL lint tool

135 Hard verification prediction tool

138 Formal verification tool

140 Recommendation tool

145 Synthesis tool

150 Equivalence checking tool

400

| Tag Name | Cell Type | Default Equation |
|---|---|---|
| MULT | Multiplier | '((log($size)/log(2))*3' |
| ADDER | Adder or Subtractor | '((log($size)/log(2))*2' |
| DIV | Division Operator | '((log($size)/log(2))*4' |
| MOD | Modules Operator | '((log($size)/log(2))*3' |
| XOR | XOR/XNOR | '((log($size)/log(2))*1' |
| COMP | Comparator | '((log($size)/log(2))*1' |
| MUX | Multiplexer | '((log($size)/log(2))*1' |
| BUF | Buffer | 0 |
| INV | Inverter | 0 |
| OTHER | Other Combinational Cells | '((log($size)/log(2))*1' |

FIG. 4

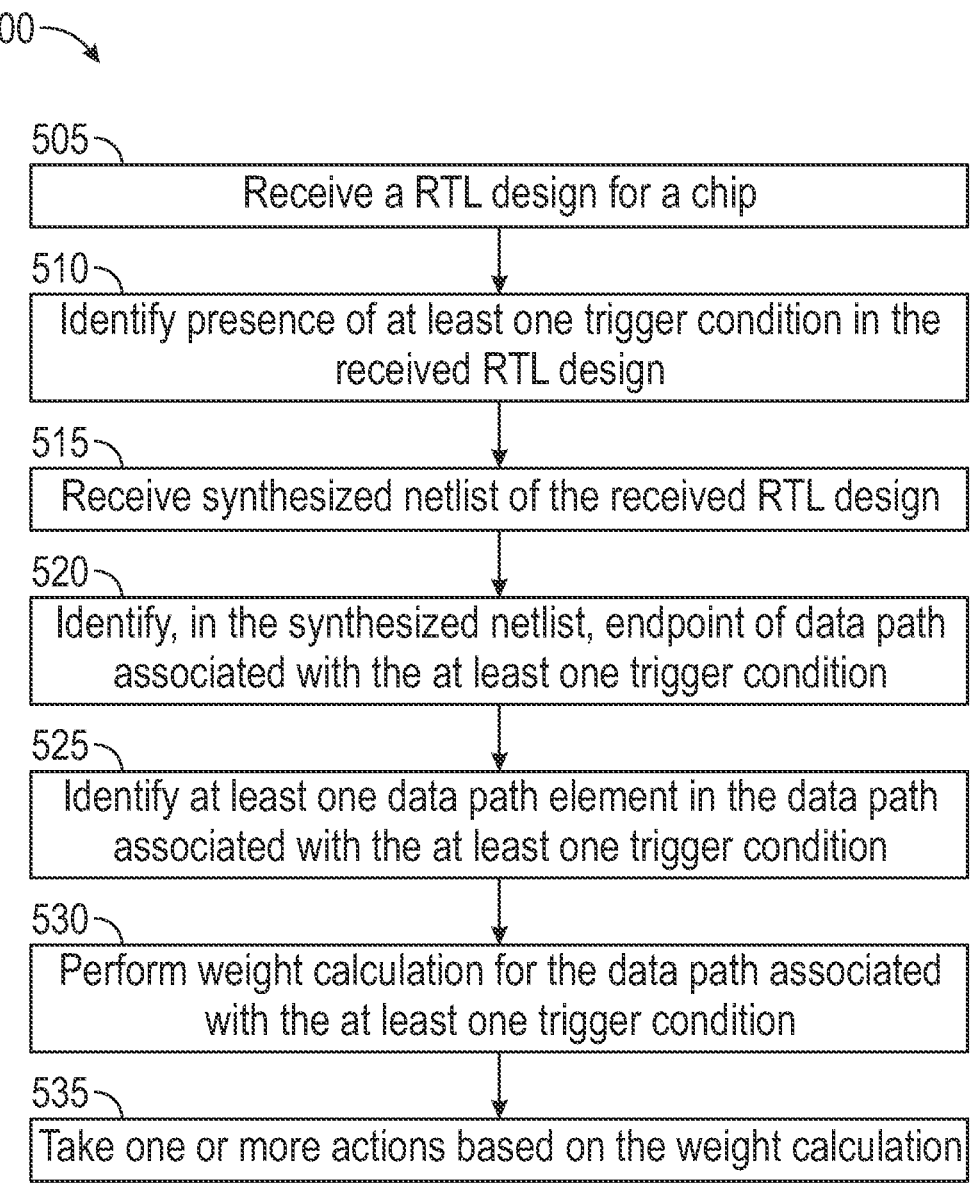

500

505
Receive a RTL design for a chip

510
Identify presence of at least one trigger condition in the received RTL design 515
Receive synthesized netlist of the received RTL design 520
Identify, in the synthesized netlist, endpoint of data path associated with the at least one trigger condition 525
Identify at least one data path element in the data path associated with the at least one trigger condition 530
Perform weight calculation for the data path associated with the at least one trigger condition 535
Take one or more actions based on the weight calculation

Figure 6:
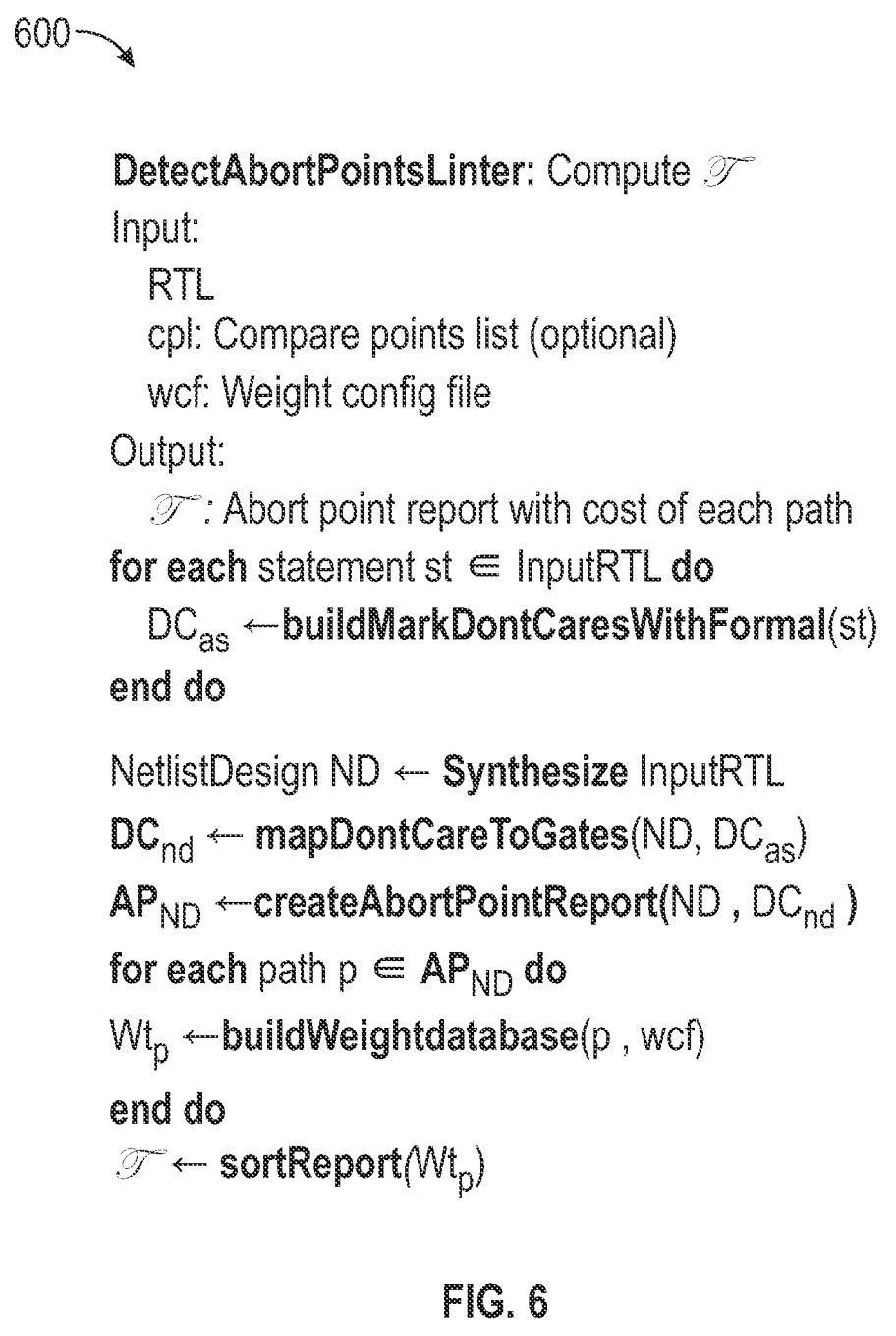

DetectAbortPointsLinter: Compute $\mathcal{T}$

Input:

RTL cpl: Compare points list (optional)

wcf: Weight config file

Output:

$\mathcal{T}$: Abort point report with cost of each path for each statement st $\in$ InputRTL do

$DC_{as}$ ←buildMarkDontCaresWithFormal(st)

end do

NetlistDesign ND ← Synthesize InputRTL $DC_{nd}$ ← mapDontCareToGates(ND, $DC_{as}$)

$AP_{ND}$ ←createAbortPointReport(ND , $DC_{nd}$ )

for each path p $\in$ $AP_{ND}$ do

$Wt_p$ ←buildWeightdatabase(p , wcf)

end do

$\mathcal{T}$ ← sortReport($Wt_p$)

1005 — Identify end points

1010 — Identify hierarchies and observable points in the fan-in of end points

1015 — Perform fan-in traversal for each observable point

1020 — Maintain count of gates in each path

1025 — Generate constraints

IDENTIFYING RTL CODE THAT CAN BE A SOURCE OF VERIFICATION COMPLEXITY FOR DOWNSTREAM EQUIVALENCE CHECKERS AND GENERATING RECOMMENDATIONS TO IMPROVE RUNTIME OF EQUIVALENCE CHECKERS

TECHNICAL FIELD

The present disclosure relates to improved methods for equivalence checking of digital circuit designs.

BACKGROUND

Electronic design automation (EDA) tools provide software tools for designing electronic systems, such as integrated circuits and printed circuit boards. The tools work together in a design flow that chip designers use to design and analyze semiconductor chips. Since a modern semiconductor chip can have billions of components, EDA tools are essential for their design.

In digital circuit design, register-transfer level (RTL) is a design abstraction that models a synchronous digital circuit in terms of the flow of digital signals (data) between hardware registers, and the logical operations performed on those signals. Register-transfer-level abstraction is used in hardware description languages (HDLs) like Verilog and VHDL to create high-level representations of a circuit, from which lower-level representations and ultimately actual wiring can be derived.

A synchronous digital circuit typically consists of registers (sequential logic) and combinational logic. Registers are usually implemented as D flip-flips, synchronize the circuit's operation to the edges of the clock signal. Registers are typically the only elements in the circuit that have memory properties. Combinational logic performs all the logical functions in the circuit and typically consists of logic gates.

When designing digital integrated circuits with a hardware description language (HDL), the designs are usually engineered at a higher level of abstraction. In HDLs the designer declares the registers, and describes the combinational logic at the register-transfer level (RTL) by using constructs such as if-then-else and arithmetic operations. Thus, RTL focuses on describing the flow of signals between registers. RTL is used in the logic design phase of an integrated circuit design process. An RTL description is usually converted to a gate-level description of the circuit by a logic synthesis tool. The synthesis results are then used by placement and routing tools to create a physical layout. Logic simulation tools may use a design's RTL description to verify its correctness.

In electronic design, a netlist is a description of the connectivity of an electronic circuitry. That is, netlist refers to the actual implementation of a particular logic or design and its interconnections. In its simplest form, a netlist consists of a list of the electronic components in a circuit and a list of the nodes they are connected to. While the structure, complexity and representation of netlists can vary considerably, the fundamental purpose of every netlist is to convey connectivity information. It can be a pictorial representation or a written one.

In digital circuit design, equivalence checking software tools are used to approve a design and verify that the synthesized netlist implements the same function as the RTL. RTL-to-netlist verification is a complex verification domain, as the RTL is aggressively optimized by modern synthesis tools to meet power, performance, area (PPA) goals for an ASIC (Application-Specific Integrated Circuit), a computer chip that combines several different circuits all on one chip. Equivalence checking tools verify logic-cones between RTL and the netlist.

When an equivalence checking software tool is unable to find any failures but is also unable to successfully verify a compare point, that is sometimes referred to as a hard verification. Typically, only a small fraction of the compare points are hard. There are some common characteristics of the logic cone that can cause the solvers to abort. One category that is difficult to verify is handling of don't cares (X) in the RTL. In digital logic, a don't care condition is an input-sequence (series of bits) for which the function output does not matter.

SUMMARY

In one example, a method of the present disclosure comprises receiving a RTL design for a chip, and identifying a presence of at least one trigger condition in the received RTL design. The method further comprises generating a circuit model of the received RTL design. In the circuit model, an endpoint of a data path associated with the identified at least one trigger condition is identified. The method further identifies, in the circuit model, at least one data path element in the data path associated with the identified at least one trigger condition. A weight calculation for the data path associated with the identified at least one trigger condition is performed, where the weight calculation is based on the identified at least one data path element in the data path. The method continues with taking one or more actions based on the weight calculation.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4 depicts a table with exemplary parameters for data path elements of the present disclosure.

FIG. 5 depicts an example method for a static equivalence checking operation, in accordance with embodiments of the present disclosure.

FIG. 6 depicts an exemplary algorithm that can be utilized to perform methods of the present disclosure.

DETAILED DESCRIPTION

Figures 1A, 1B:
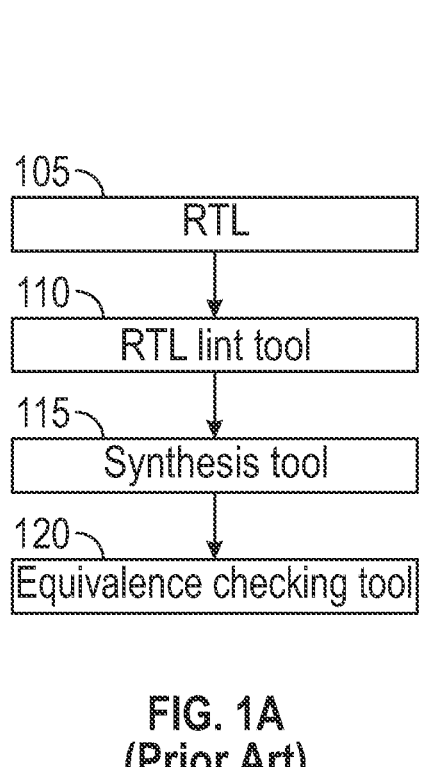
FIG. 1A depicts an example simplified chip design flow of prior systems.
FIG. 1B depicts an example simplified chip design flow of the present disclosure.

Aspects of the present disclosure relate to improving runtime performance of equivalence checkers by a shift left process that identifies RTL code that can be a source of verification complexity for the downstream equivalence checker, and generating recommendations for reducing that verification complexity before the formal equivalence checker is actually run.

Equivalence checkers verify the logical equivalence of RTL to an optimized gate-level netlist. Synthesis tools can generate netlists that are optimized for power, performance, and area to meet requirements of circuit designers. Equivalence checkers verify the RTL against the optimized netlist using formal techniques. To pass, verification needs to pass on every compare point. Various techniques can be used to compare and prove equivalence on the compare points.

Moreover, equivalence checking is an NP-complete problem, and it may happen that verification on some points may not converge. That is, for some compare points, a software tool may not be able to prove equivalence or non-equivalence. This may be primarily because of the lack of similarity between the RTL and the optimized netlist. Resolving these difficult points can be a challenge and, in some cases, re-synthesis by disabling one or more classes of netlist optimizations can help with the verification.

Alternatively, the RTL can be re-coded by eliminating redundancies or constructs that are known to cause difficult verifications. In many cases, this occurs a late stage of the design process and changes can no longer be made to RTL or synthesis.

Aspects of the present disclosure provide for an RTL lint software tool to identify RTL constructs that can provide an early warning to customers about potential difficult verifications. Customers can then take steps during the linting stage to re-code that piece of RTL, or setup synthesis constraints that prevent aggressive optimizations on these cones, thus avoiding the risk of difficult verifications and getting more predictable approvals of designs. With this change, the overall turnaround time for circuit design tools can be greatly decreased.

Further, lint tools are executed early in the circuit design process before the design is synthesized. With the output from the lint tools, a user may choose to modify the RTL, which can then be passed on to downstream tools.

The present disclosure provides multiple advantages over prior systems. By using RTL lint technology to predict that certain endpoints will be problematic during later equivalence checking, the process can take advantage of a shift left. That is, the problem areas are identified earlier in the process, reducing time, cost, and complexity of the design process. Further, by identifying potentially problematic areas of an RTL design in an RTL lint tool, the RTL design can be updated and optimized to minimize the potential for downstream verification complexity. In addition, by identifying potentially problematic areas during RTL linting, constraints can be generated for a synthesis tool before the synthesis tool is actually executed. This further minimizes complexity of a downstream equivalence checking operation. Using embodiments of the present disclosure, >95% of potential abort points of a downstream equivalence checker can be predicted in advance of actually executing the downstream equivalence checker. As such, a runtime of the downstream equivalence checker can be reduced from ~97 hours to less than 1 hour, in some embodiments.

FIG. 1A depicts an example simplified chip design flow of prior systems. In FIG. 1A, an RTL design 105 is designed by a human user, to represent a chip's design at the RTL level. An RTL lint tool 110 is then used to provide structural analysis of the RTL design, and to verify adherence of the design to specified coding rules. RTL linting is used to prevent synthesis issues in a downstream tool, functional bugs, and enforcing coding styles for readability and reuse of design.

Synthesis tool 115 is subsequently used to synthesize the RTL design into a gate-level netlist design. In addition, synthesis tool 115 may comprise multiple software tools that collectively or individually optimize the netlist to reduce power consumption, reduce area on the chip, and increase performance of the chip. Equivalence checking tool 120 comprises an equivalence checker that compares the optimized netlist design from synthesis tool 115 to the RTL design from RTL lint tool 110 to ensure that the two are functionally equivalent. That is, equivalence checking ensures that synthesis tool 115 has not optimized the design to an extent that it is no longer functionally equivalent to the original RTL design.

Equivalence checking tools are used as sign-off to verify that the synthesized netlist implements the same function as the RTL. RTL-to-netlist verification is the most complex verification domain as the RTL is aggressively optimized by modern synthesis tools to meet power, performance, area (PPA) goals for the ASIC. Equivalence checking tools verify logic-cones between RTL and the netlist.

Hard verification occurs when the tool is unable to find any failures but is also not able to complete the verification to claim SUCCESS on that compare point. Often a small fraction of the design points are hard. There are some common characteristics of the logic-cone that can cause equivalence checking solvers to abort.

One category is handling of don't-cares ('X') in the RTL. The synthesis tools are free to optimize the 'X' and the choice of '0 or 1' is determined by the synthesis tool to meet PPA. The equivalence checking tool has to preserve the X-interval and check consistency (X in RTL is consistent with '0' or '1' in netlist). A cone can get very complex if these don't-cares (either explicit in the RTL or implicitly inferred by the tool) are present along with other complex logic like Datapath or XOR chains (CRC networks). Currently, there is no way to catch these upfront at the linting level and costly design iterations are lost.

FIG. 1B depicts an example simplified chip design flow of the present disclosure. In FIG. 1B, an RTL design 125 is used by a human user to represent a chip's design at the RTL level, as discussed herein. In some embodiments, RTL design 125 is the same or similar to RTL design 105 of FIG. 1A.

RTL lint tool 130 is then used to provide structural analysis of the RTL design, to verify adherence of the design to specified coding rules, and perform other functions. RTL linting is used to prevent synthesis issues in a downstream tool, functional bugs, and enforcing of coding styles for readability and reuse of design. In addition, RTL lint tool 130 comprises a hard verification prediction tool 135, formal verification tool 138, and recommendation tool 140. In various embodiments, functions of one or more of hard verification prediction tool 135, formal verification tool 138, and/or recommendation tool 140 may be combined into fewer tools, or separated into additional tools.

The hard verification prediction tool 135 may perform an informal "dummy" synthesis analysis, to predict what a synthesized optimized netlist generated by a downstream synthesis tool would be. This informal synthesis analysis performed in RTL lint tool 130 generates a "circuit model". Subsequent to the dummy synthesis, hard verification prediction tool 135 may perform a post synthesis lint analysis to detect RTL constructs that may be problematic for a later equivalence check of the original RTL design and the predicted netlist. As such, potential problems that may arise from the downstream equivalence checking process can be identified at this earlier linting stage of the design flow, in a "shift left" for the design flow.

Formal verification tool 138 may verify other aspects of the RTL design, as discussed herein. Recommendation tool 140 may utilize the results from the hard verification prediction tool 135 to recommend a change in the RTL level design and/or recommend a particular constraint parameter be used in the downstream synthesis process. Recommendation tool 140 may generate a report of predicted abort points (i.e., compare points that are unlikely to converge during equivalence checking by the downstream equivalence checking tool).

Based on the recommendation tool 140, the user can make edits to the RTL design, in an iterative manner, until a desired level of equivalence is achieved. In this way, potential errors are identified and fixed at an earlier stage of the chip design process, reducing time, cost, and complexity for the overall design process. Further, recommendation tool 140 can recommend one or more parameters to constrain a downstream synthesis process in synthesis tool 145, as discussed further herein. In addition, RTL lint tool 130 may generate a report of weights of data paths that are potentially problematic, cost of potentially problematic data path, and/or an analysis of potential abort points for the downstream equivalence checking tool.

Once the user completes the RTL lint tool 130 process, the synthesis tool 145 synthesizes the RTL design, in a similar manner to synthesis tool 115 of FIG. 1A. Finally, equivalence checking tool 150 verifies the equivalence of the generated netlist from synthesis tool 145 to the RTL design from RTL lint tool 130, in a same or similar manner as equivalence checking tool 120 of FIG. 1A.

Figure 2:
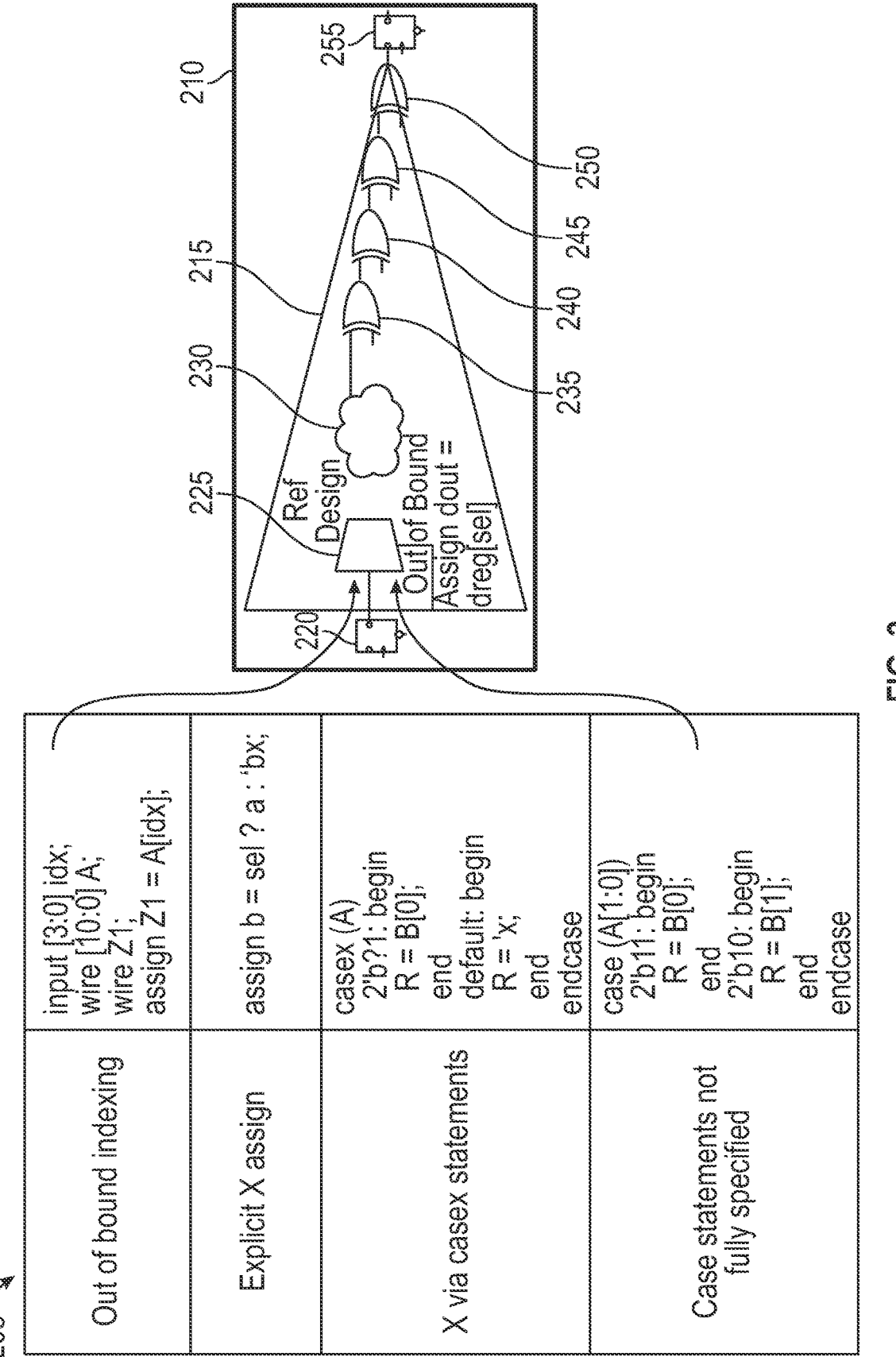
FIG. 2 depicts an exemplary static abort point analysis performed in accordance with embodiments of the present disclosure.

FIG. 2 depicts an exemplary static abort point analysis performed by an RTL lint tool, such as by hard verification prediction tool 135 of RTL lint tool 130 of FIG. 1A. In the static abort point analysis depicted in FIG. 2, table 205 shows exemplary RTL styles that may cause 'Hard verification' since these styles generate "don't care" conditions and complex data paths. While four specific RTL styles are depicted in table 205, there may be other RTL styles in other embodiments that are not depicted in table 205. The RTL styles referenced in table 205 are also sometimes referred to herein as trigger conditions.

A first RTL style depicted in table 205 is out of bound indexing. The "idx" variable in the RTL design can attain a value that can cause out of bound indexing for the variable "A", since "A" has a defined range of 10 to 0.

A second row of table 205 depicts an exemplary RTL design that explicitly assigns a don't care, represented by the letter X. As discussed herein, don't care conditions can be problematic for equivalence checking tools. A third row of table 205 depicts an exemplary RTL design for a don't care via casex statement, and a fourth row of table 205 depicts an exemplary RTL design where the case statement is not fully specified. That is, the variable "R" can be undefined when "A" attains other possible values.

Circuit model 210 depicts a logic cone 215 that is generated from a circuit model of an RTL design. A register 220 serves as a starting point to logic cone 215, and register 255 serves as an end point to logic cone 215. In one example, register 220 and/or register 255 is a flip flop gate. In between the registers 220 and 255 is an exemplary complex data path. In the example depicted in FIG. 2, the complex data path has a chain of multiplexer (MUX) 225, additional components 230 (which may be multipliers, adders, etc.), and a series of XOR gates 235, 240, 245, and 250.

Hard verification prediction tool 135 assigns a weight to each endpoint (such as register 255), denoting a complexity of solving the endpoint of the logic cone. That is, a higher weight means that downstream equivalence checking tool 150 will have a harder time verifying equivalence of a later synthesized netlist from circuit model 210 to the RTL design, while a lower weight means that downstream equivalence checking tool 150 will likely have an easier time verifying equivalence of the later synthesized netlist from circuit model 210 to the RTL design.

In general, a probability of an equivalence checking tool experiencing a hard verification is higher if the don't care condition is far away from the endpoint (i.e., at the base of logic cone 215). However, these problematic RTL styles don't always cause design issues even though equivalence checking tools may have difficulty in verifying equivalence with a synthesized netlist. To make the equivalence checking easier, these don't care styles can be combined with multiple large Datapath operations, such as with adders or multipliers. A don't care condition alongside an XOR chain may also result in a higher weightage, based on the size of the XOR chain.

In some embodiments, the weight is based on one or more of: a number of components in the chain of circuit model 210 (i.e., length of the complex data path chain), width of input(s) to element(s) in the chain, size of input(s) of element(s) in the chain, location of don't care conditions (such as don't care conditions generated by the RTL designs in table 205), or distance of don't care condition from endpoint. In some examples, the generated weight for each endpoint is a value between 0 and 1. In other examples, the generated weight for each endpoint is a value between 1 and 100. In further examples, the generated weight for each endpoint is a customizable range that can be set by a user of RTL lint tool 130.

Even if no don't care conditions are present, equivalence checkers can face issues with hard verifications with other RTL designs as well. For example, even without a don't care condition, standalone XOR chains may require CRC (Cyclic Redundancy Check) logic which may cause issues downstream. Furthermore, a large number of gates/combo-cells in the logic cone of an endpoint (exceeding a threshold value), will cause more weight in case fewer hierarchies are present in the fan-in of the logic cone. As such, detection of don't care conditions by hard verification prediction tool 135 needs to be highly accurate. In addition, the complexity of the data path (and hence weight) may depend on factors such as one or more of: a gate type (OR, XOR, Adder, etc.), size of the gate (4-bit/8-bit adder/multiplier, etc.), and the length of XOR chain, among other factors.

Figure 3:
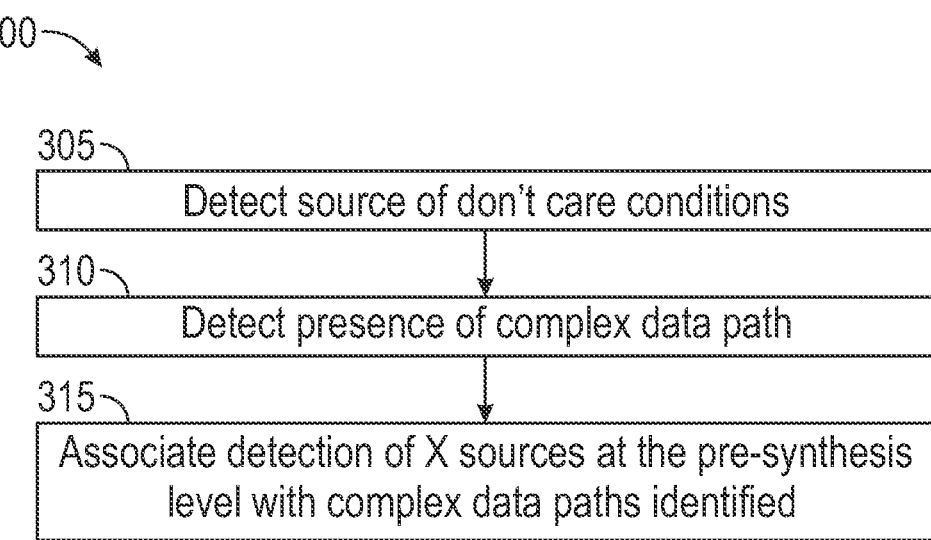
FIG. 3 depicts an exemplary method for practicing embodiments of the present disclosure.

FIG. 3 depicts an exemplary method 300 for practicing embodiments of the present disclosure. At block 305, don't care ("X)" sources in the RTL design are detected, as don't care sources are a trigger condition for RTL lint tool 130. For illustration purposes, one example RTL design is listed below:

input [1:0] in;
    always begin
    for(int i=0; i<8; i++)
        if(i<2) out[i]=in[i]

In this example, there is a proper "if" condition, and thus, there will not be any out of bound variables. Hence the output "out" won't be treated as a valid X source. Formal verification tools (such as formal verification tool 138 of FIG. 1B) will be able to detect if there is any real out of bound situation, and thus, this design is predicted to cause an abort point for the equivalence checker. That is, the equivalence checker will be unable to determine equivalence of the RTL and corresponding netlist within a given time frame, and will have to 'abort' the checking operation.

A second example RTL design is listed below:

```
casex (A)
    2'b?1: R = B[0];
    2'b1?: R = B[1];
    default: R = 'x;
    endcase
```

In this example, the default case will not be executed, and hence, "R" is not a valid "X" source. The equivalence checking tool will likely be able to determine that R can attain any "X". As such, this design is predicted to not cause an abort point for the downstream equivalence checking tool 150.

A third example RTL design is listed below:

```
casex (A)
    2'b?1:   R = B[0];
    default: R = 'x;
    endcase
```

In this example, "R" is a valid "X" source, and thus, this may cause a hard verification condition for an equivalence checking tool, and thus may be a potential abort point for the downstream equivalence checker at the equivalence checking tool 150.

A fourth example RTL design is listed below:

```
assign A = func(in1, in2);
// Assume output of func can be 2'b10 only
case (A)
    2'b11: R = B[0];
    2'b10: R = B[1];
    endcase
```

In this example, the output of function "func" can only be 2'b10. Hence, "R" can achieve a deterministic value. Statically, the lint tool may not be able to determine all the possible values that "A" can attain. However, this can be accurately identified by an equivalence checking tool. Thus, "R" may be considered by hard verification prediction tool 135 to not be acting as an "X" source and thus will not be predicted to be an abort point for the downstream equivalence checking tool 150.

At block 310 of the method 300, hard verification prediction tool 135 detects whether a complex data path is present in the design. A complex data path may include one or more of an adder, multiplier, XOR chain, among other elements. In some embodiments, a cost is attached to each logic gate in the data path. A higher cost is attributed to a higher probability of an equivalence checker being unable to converge on a solution for an endpoint. In exemplary embodiments, a user can modify and attach custom weights to determine a cost of each data path.

FIG. 4 depicts a table 400 with exemplary tag names, cell types, and a default equation to determine a cost for each type of component. To indicate the size of an operator, a user can specify the variable '$size' in the equation. To indicate the back-to-back count of the operators, a user can specify the variable '$count' in the equation. In one example, a user can define a cost of a multiplier in the data path according to the following equation: '(log($size)/log(2))*3'. In another example, a user can define a cost of a comparator in the data path according to the following equation: '(log($size)/log (2))*$count'

Returning to FIG. 3, at block 315 of the method 300, hard verification prediction tool 135 can associate the detection of X sources at the pre-synthesis level (in an RTL design) with complex data paths identified at a post dummy synthesis level (in a generated circuit model). In order to accomplish this, a handshake is conducted between data model(s) of an RTL lint tool. The handshake can happen via a file or by keeping both data models in memory of RTL lint tool 130. That is, keeping a relevant data model of a dummy synthesis tool in memory of RTL lint tool 130.

FIG. 5 depicts an example method 500 that hard verification prediction tool 135 may conduct during a static equivalence checking operation. At block 505, hard verification prediction tool 135 receives a RTL design for a chip. At block 510, hard verification prediction tool 135 identifies the presence of at least one trigger condition in the received RTL design. In some embodiments, the at least one trigger condition may be at least one of: an out of bound indexing condition, an explicitly assigned don't care condition, a don't care condition via a casex statement, a case statement that is not fully specified, a chain of XOR gates exceeding a predetermined length. In other embodiments, the at least one trigger condition may be another condition present in the RTL design.

At block 515 of the method 500, hard verification prediction tool 135 generates a circuit model of the received RTL design. In some embodiments, RTL lint tool 130 generates the circuit model, as discussed herein. In other embodiments, RTL lint tool 130 receives the circuit model from another tool, such as downstream synthesis tool 145 of FIG. 1B. In some embodiments, the circuit model has undergone one or more synthesis optimization operations. In other embodiments, the circuit model for comparison has not undergone synthesis optimization operations.

While not expressly depicted in the method 500, hard verification prediction tool 135 may also identify a location in the circuit model of the at least one trigger condition. In the case of an identified don't care condition in the RTL design, hard verification prediction tool 135 may determine a source of the don't care condition in the circuit model.

At block 520 of the method 500, hard verification prediction tool 135 identifies, in the circuit model, an endpoint of a data path associated with the at least one trigger condition, i.e., the data path where the at least one trigger condition is located. In some embodiments, an endpoint is identified for each trigger condition identified from block 510.

At block 525 of the method 500, hard verification prediction tool 135 identifies at least one complex data path element in the data path associated with the at least one trigger condition. In exemplary embodiments, the at least one complex data path element is identified based on the circuit model. The identification of complex data path elements may comprise identification of at least one a multiplier, adder, subtractor, division operator, modules operator, XOR, comparator, multiplexer, buffer, inverter, and/or other data path elements such as those depicted in the table 400 of FIG. 4.

At block 530 of the method 500, hard verification prediction tool 135 performs a weight calculation for the data path associated with the at least one trigger condition. In one example embodiment, a weight is calculated for each data path element present from the trigger condition to a compare point (which may be the endpoint identified at block 520). In one example, hard verification prediction tool 135 performs a weight calculation for each data path element present in the entire data path containing the trigger condition. In another example, hard verification prediction tool 135 performs a weight calculation for any portion of the data path, the portion comprising the trigger condition.

At block 535 of the method 500, hard verification prediction tool 135 may take one or more actions based on the weight calculation. In one example, hard verification prediction tool 135 may take an action of generating a report detailing one or more trigger conditions, identified data path elements, weight for the data path, and/or cost of the data path with the trigger condition. In another example, hard verification prediction tool 135 may take an action of communicating with a recommendation tool (such as recommendation tool 140 of FIG. 1B) to generate one or more recommendations for improving the chip design. For example, recommendation tool 140 may recommend one or more changes to the RTL design, which can be conducted within RTL lint tool 130. In a further example, recommendation tool 140 may recommend one or more constraints to be utilized by downstream synthesis tool 145.

FIG. 6 depicts an exemplary algorithm 600 that can be utilized by hard verification prediction tool 135 to perform a method, such as the exemplary method 500 of FIG. 5. In algorithm 600, an RTL lint tool is used to detect potential abort points of a downstream equivalence checking tool. Inputs to the algorithm comprise an RTL design, a configuration file regarding calculated weights, and optionally a list of compare points in the chip design. An output of the algorithm 600 is an abort point report with a determined cost of each data path.

For the input RTL design, each don't care condition is identified and marked. The input RTL design is further synthesized and a circuit model is generated. Each identified don't care condition is mapped to a particular gate in the circuit model. For each path, a weight is calculated. The calculated weights and corresponding data may be stored in a database, or other storage medium. The algorithm 600 further provides instructions to create an abort point report.

Figure 7:
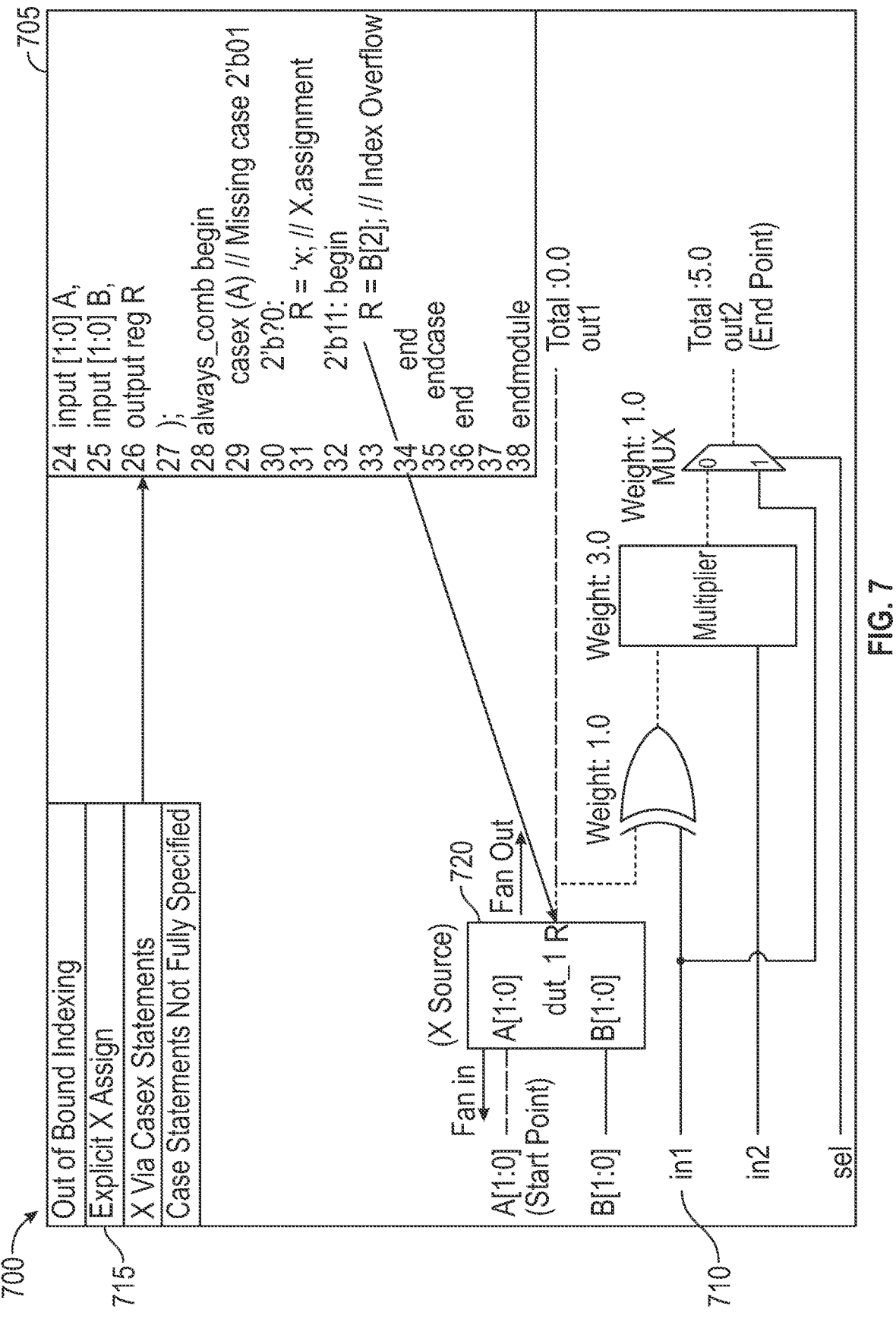
FIG. 7 depicts an exemplary screenshot from an RTL lint tool, practicing embodiments of the present disclosure.

FIG. 7 depicts an exemplary screenshot 700 from an RTL lint tool, practicing embodiments of the present disclosure, such as exemplary the method 300 of FIG. 3. In the screenshot 700, box 705 depicts a portion of an RTL design for comparison, with a don't care condition highlighted. Graphic 710 depicts a data path for a circuit model. The data path comprises a XOR gate, adder, or multiplier. The four particular conditions identified in table 715 are flagged in the RTL design. In the exemplary screenshot 700, the condition of "X via casex statements" is identified in the RTL design. Further, a gate level location of the corresponding snippet of the RTL design is identified in graphic 710. The register 720 is then identified as the "X source", i.e., the source of the don't care condition.

In addition to presence of don't care conditions in RTL design, other design elements may also trigger potential problems in downstream equivalence checkers. For example, a standalone long XOR chain. CRC or ECC (Error Correction Code) logic can generate long XOR chains. While these XOR chains by themselves are not hard to verify, a hard verification can occur when these XOR chains are ungrouped and combined with neighboring hierarchies containing additional XOR chains. Smart linting, such as that discussed herein, can identify "long" XOR chains and customers can use this guidance to preserve these XOR hierarchies during synthesis.

Figure 8:
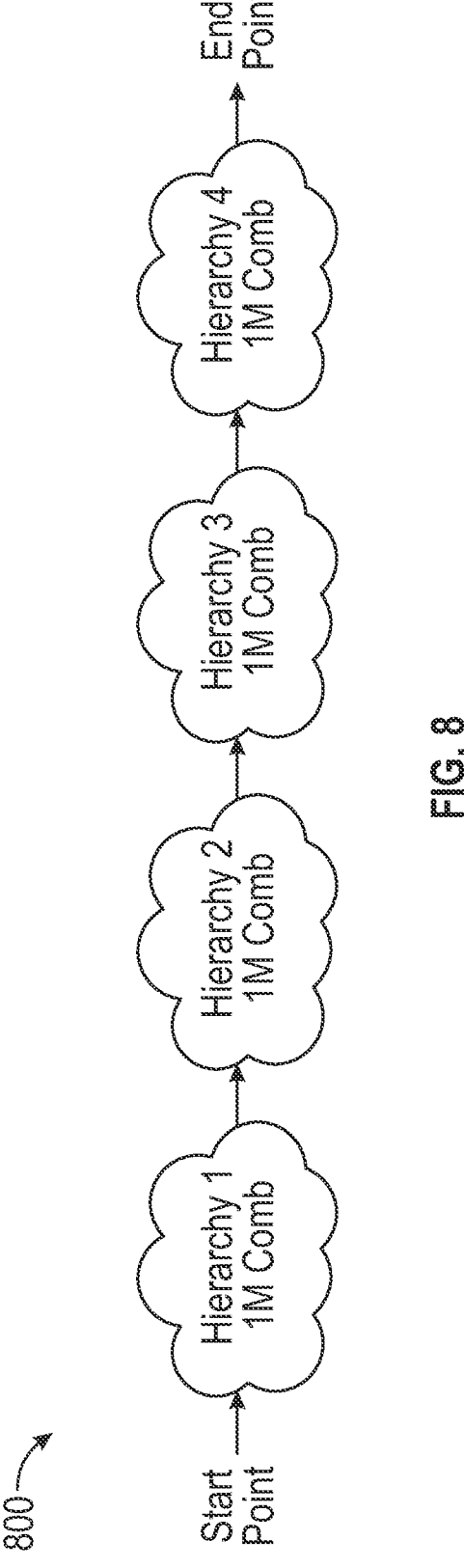
FIG. 8 depicts an exemplary architecture of a long XOR chain of embodiments of the present disclosure.

FIG. 8 depicts an exemplary architecture 800 of a long XOR chain. Synthesis tools may 'auto-ungroup' parts of this chain in order to improve QoR (Quality of Result). However, with auto-ungrouping, equivalence checkers may face verification challenges due to large number of ungrouped gates. In embodiments of the present disclosure, a user can choose a threshold value with respect to a maximum number of ungrouped gates in the fan-in cone. The RTL lint tool will analyze the fan-in cone and determine if ungrouping a certain set of cascaded hierarchies can lead to a large number of ungrouped gates, i.e., the number of ungrouped gates is over the threshold limit. If the RTL tool detects a possibility of this occurring, it can generate a constraint to guide a downstream synthesis tool user to not 'ungroup' certain hierarchies.

Figure 9:
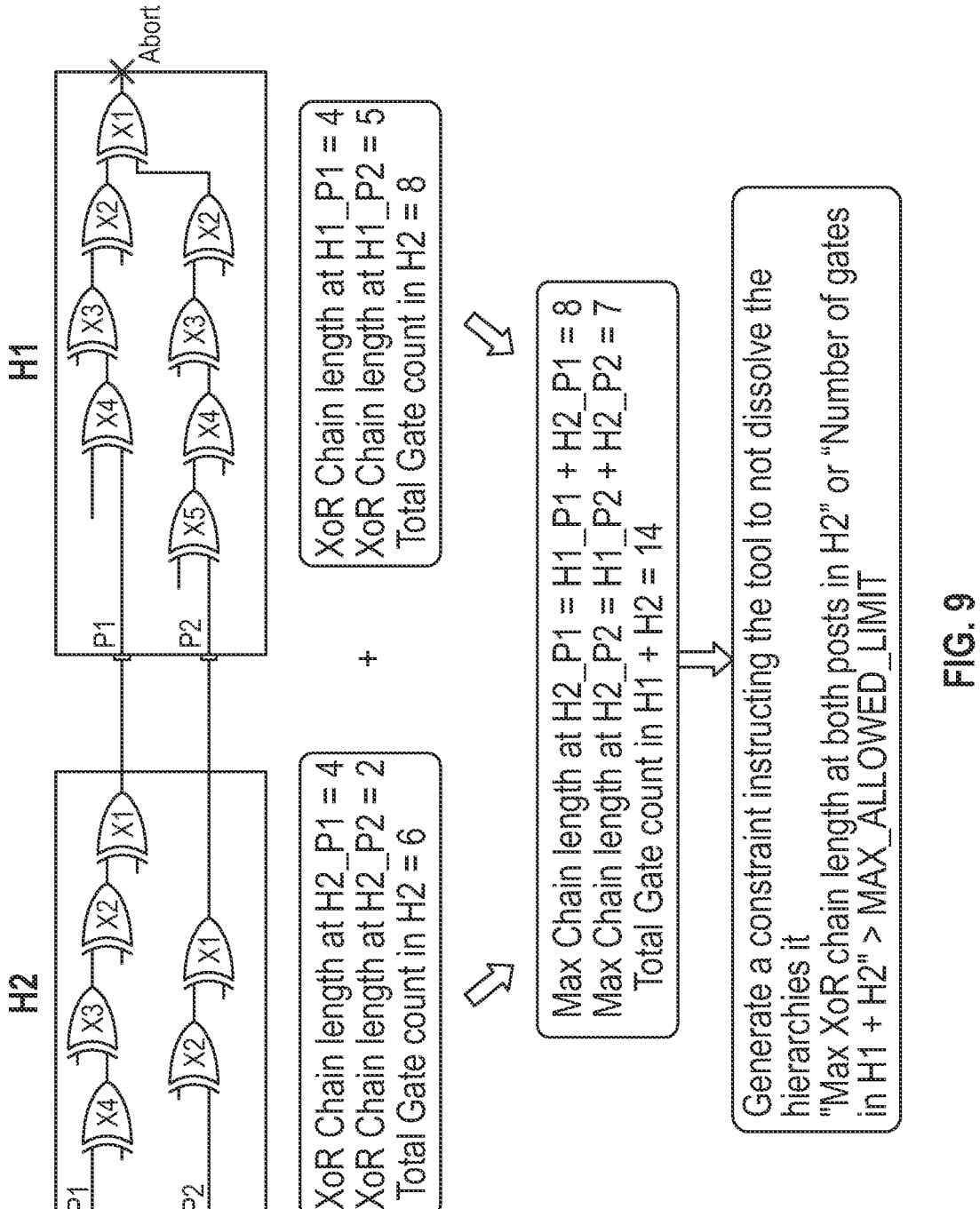
FIG. 9 depicts an exemplary process for generating a constraint restricting a downstream synthesis tool, in accordance with embodiments of the present disclosure.

FIG. 9 depicts an exemplary process 900 for generating a constraint restricting a downstream synthesis tool from ungrouping certain hierarchies. FIG. 9 depicts hierarchy H2 and hierarchy H1 of XOR chains. Each of hierarchies H2 and H1 comprise data paths P1 and P2. A XOR chain length for each path of each hierarchy is first determined, along with a total gate count for each hierarchy. From this, a chain length for each data path is determined for the combined hierarchies, along with a total gate count for the combined hierarchies. Finally, a constraint is generated to not dissolve the hierarchies if a maximum XOR chain length or number of gates is greater than a maximum allowed limit, where the maximum allowed limit is a customizable value by the user.

Figure 10:
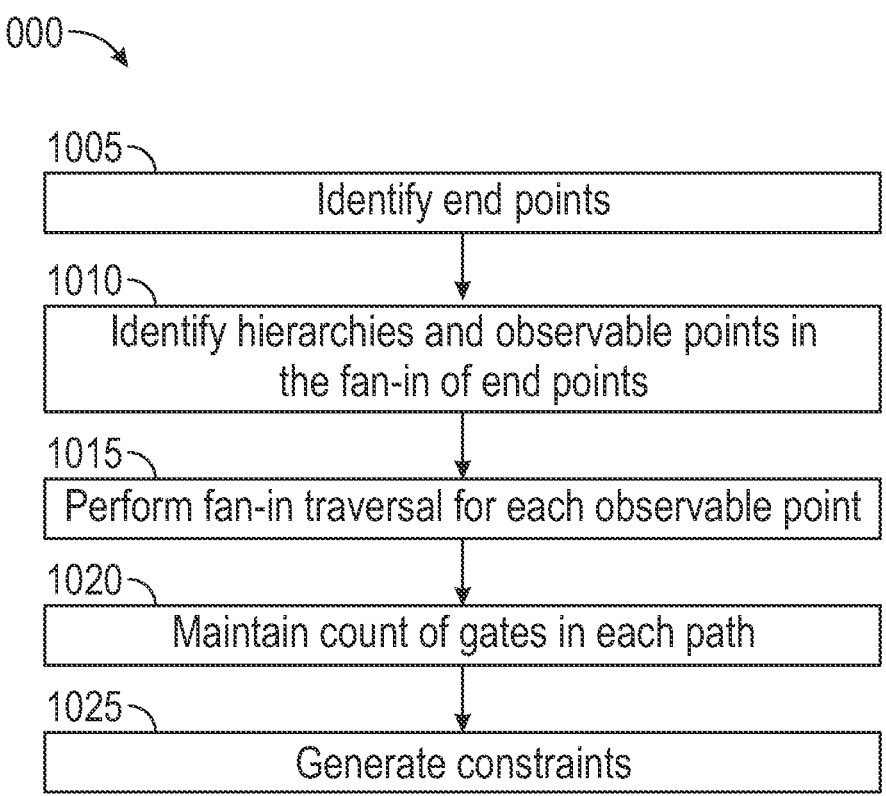
FIG. 10 depicts an exemplary method for generating a constraint restricting a downstream synthesis tool, in accordance with embodiments of the present disclosure.

FIG. 10 depicts an exemplary method 1000 flow chart for generating a constraint restricting a downstream synthesis tool. In exemplary embodiments, the method 1000 of FIG. 10 can be used with the process 900 of FIG. 9. At block 1005 of the method 1000, RTL lint tool (such as RTL lint tool 130 of FIG. 1B), identifies end points of data paths generated from an RTL design. At block 1010, RTL lint tool identifies hierarchies and observable points in the fan-in of the end points. In one example, the identified hierarchies are hierarchical chains of XOR chains. In other examples, other elements may also be present in addition to XOR chains. At block 1015, RTL lint tool performs a fan-in traversal for each observable point identified at block 1010. At block 1020, RTL lint tool maintains a count of gates that are present in each path, such as the paths identified at block 1005. At block 1025, RTL lint tool generates one or more constraints for a downstream synthesis tool. As discussed herein, the constraint may constrain a maximum number of gates or a maximum chain length that is allowed, before a XOR chain is ungrouped and segmented into shorter chain lengths.

Figure 11:
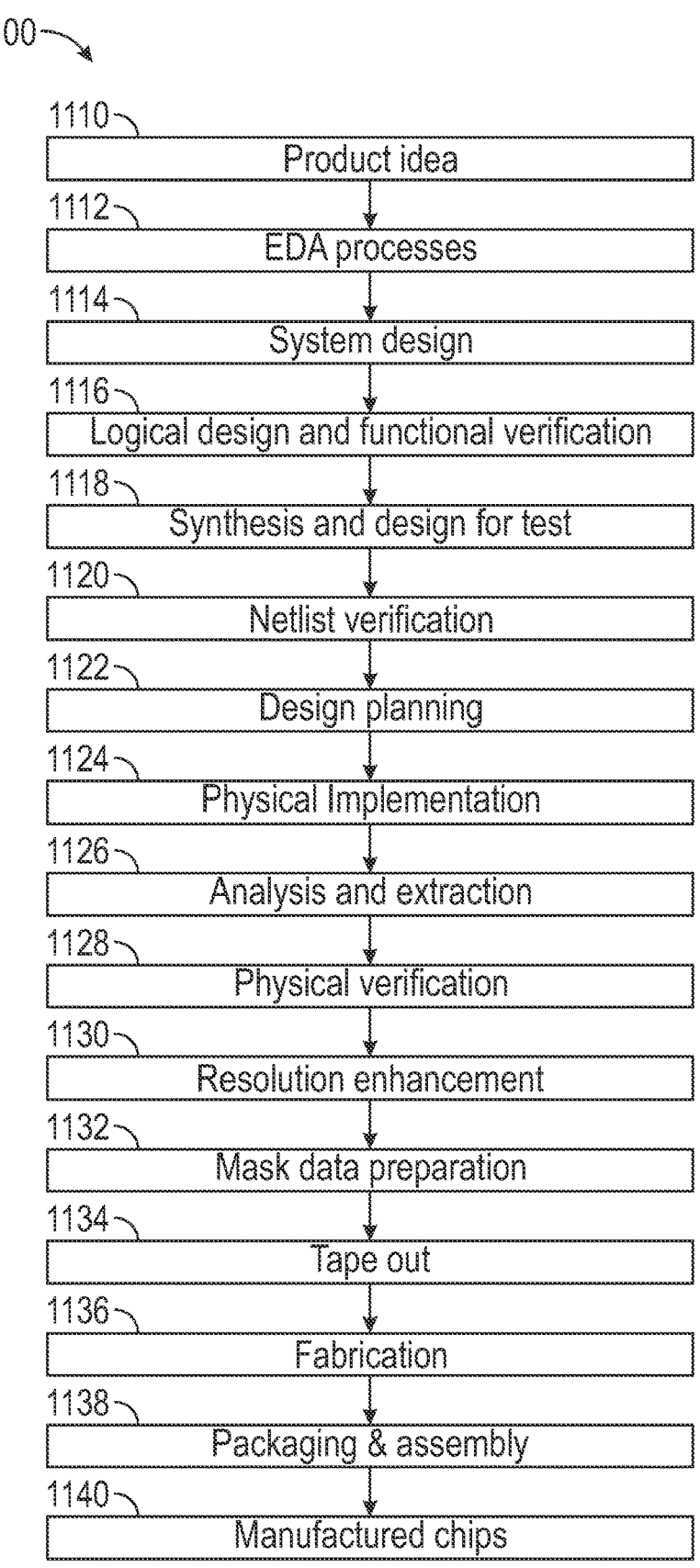
FIG. 11 illustrates a flowchart of various processes used during the design and manufacture of an integrated circuit in accordance with some embodiments of the present disclosure.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 11. The processes described by be enabled by EDA products (or EDA systems).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

Figure 12:
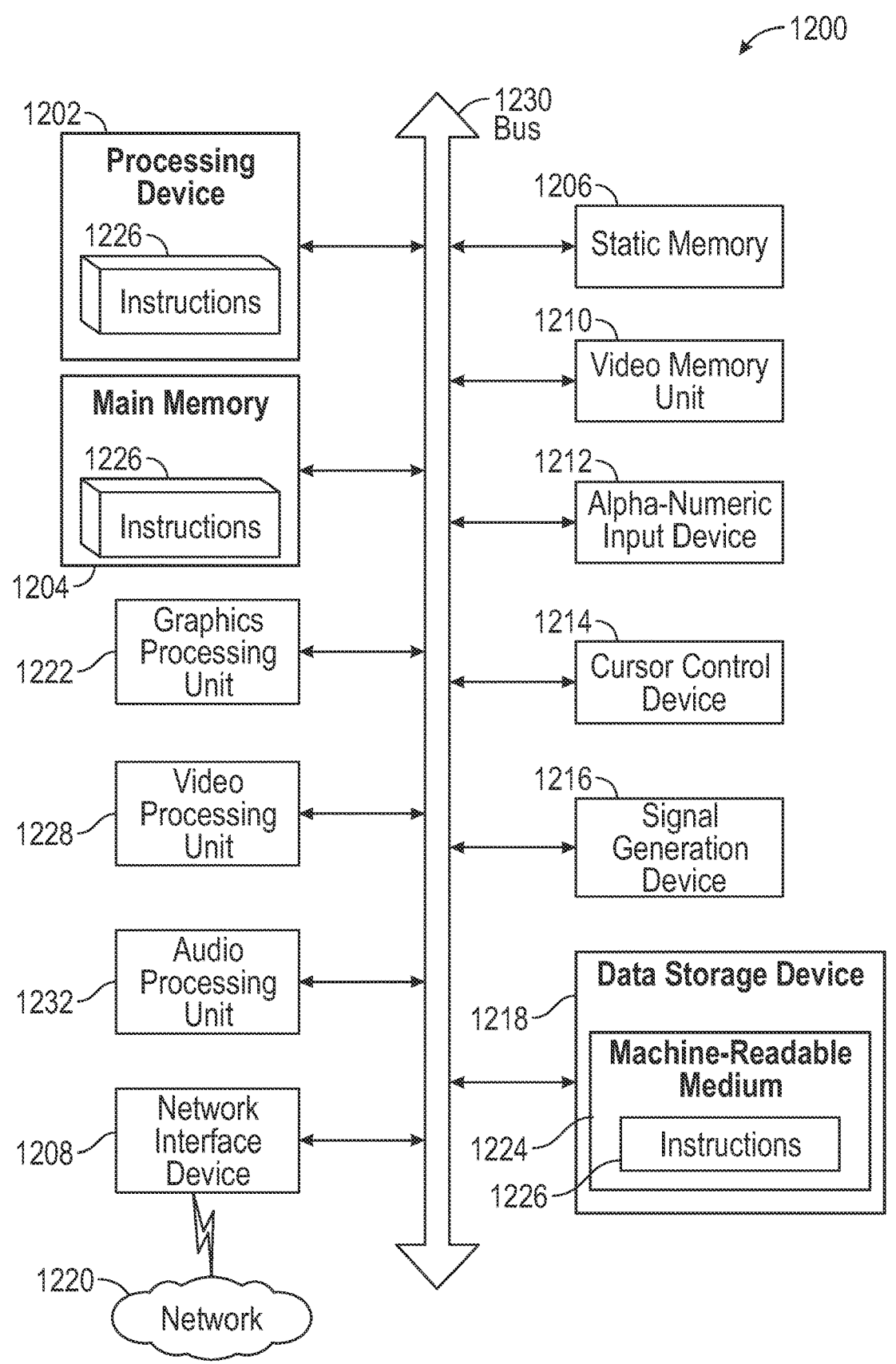
FIG. 12 illustrates an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for linting of a Register-Transfer-Level (RTL) chip design, the method comprising:

receiving a RTL design for a chip;

identifying a presence of at least one trigger condition in the received RTL design;

generating a circuit model of the received RTL design;

identifying, in the circuit model, an endpoint of a data path associated with the identified at least one trigger condition;

identifying, in the circuit model, at least one data path element in the data path associated with the identified at least one trigger condition;

performing a weight calculation for the data path associated with the identified at least one trigger condition, the weight calculation based on the identified at least one data path element in the data path, wherein performing the weight calculation comprises traversing fan-in paths of the endpoint associated with the at least one trigger condition and accumulating a cumulative weight based on types of data path elements encountered during the traversal; and taking one or more actions based on the weight calculation.

2. The method of claim 1, wherein the at least one trigger condition is an out of bound indexing condition.

3. The method of claim 1, wherein the at least one trigger condition is an explicitly assigned don't care condition.

4. The method of claim 1, wherein the at least one trigger condition is a don't care condition via a casex statement.

5. The method of claim 1, wherein the at least one trigger condition is a case statement that is not fully specified.

6. The method of claim 1, wherein the at least one trigger condition is a chain of XOR gates exceeding a predetermined length.

7. The method of claim 1, wherein the at least one data path element in the data path is at least one of: a multiplier, adder, subtractor, division operator, modules operator, XOR, comparator, multiplexer, buffer, or inverter.

8. The method of claim 1, wherein taking the one or more actions based on the weight calculation comprises generating at least one recommendation for a change in the received RTL design for the chip.

9. The method of claim 1, wherein taking the one or more actions based on the weight calculation comprises transmitting one or more constraints to a downstream synthesis tool.

10. The method of claim 9, wherein taking the one or more actions based on the weight calculation comprises generating at least one recommendation for a constraint parameter for the downstream synthesis tool.

11. The method of claim 10, wherein taking the one or more actions based on the weight calculation comprises generating a recommendation for the downstream synthesis tool to not ungroup a hierarchical chain of XOR gates.

12. A system comprising:

a memory storing instructions; and a processor coupled with the memory, the processor configured to execute the instructions to cause the processor to:

receive a RTL design for a chip;

identify a presence of at least one trigger condition in the received RTL design;

generate a circuit model of the received chip design specified at the RTL;

identify, in the circuit model, an endpoint of a data path associated with the at least one trigger condition;

perform a weight calculation for the data path associated with the at least one trigger condition, wherein performing the weight calculation comprises traversing fan-in paths of the endpoint associated with the at least one trigger condition and accumulating a cumulative weight based on types of data path elements encountered during the traversal predict a potential abort point for a downstream equivalence checking tool based on the cumulative weight; and take one or more actions based on the predicted potential abort point.

13. The system of claim 12, wherein the at least one trigger condition is an out of bound indexing condition.

14. The system of claim 12, wherein the at least one trigger condition is a presence of a don't care condition.

15. The system of claim 12, wherein the at least one trigger condition is a case statement that is not fully specified.

16. The system of claim 12, wherein the at least one trigger condition is a chain of XOR gates exceeding a predetermined length.

17. The system of claim 12, wherein taking the one or more actions comprises generating at least one recommendation for a change in the received RTL design for the chip.

18. The system of claim 12, wherein taking the one or more actions comprises generating at least one recommendation for a constraint parameter for a downstream synthesis tool.

19. The system of claim 12, wherein taking the one or more actions based on the weight calculation comprises generating a recommendation for a downstream synthesis tool to not ungroup a hierarchical chain of XOR gates.

20. A non-transitory computer readable medium comprising stored instructions, which when executed by at least one processor, causes the at least one processor to perform a method comprising:

receiving a RTL design for a chip;

identifying a presence of at least one trigger condition in the received RTL design;

generate a circuit model of the received RTL design;

identifying, in the circuit model, an endpoint of a data path associated with the identified at least one trigger condition;

identifying, in the circuit model, at least one data path element in the data path associated with the identified at least one trigger condition;

performing a weight calculation for the data path associated with the identified at least one trigger condition, the weight calculation based on the identified at least one data path element in the data path, wherein performing the weight calculation comprises traversing fan-in paths of the endpoint associated with the at least one trigger condition and accumulating a cumulative weight based on types of data path elements encountered during the traversal; and taking one or more actions based on the weight calculation.

* * * * *